US010318684B2

(12) United States Patent
Dai et al.

(10) Patent No.: US 10,318,684 B2
(45) Date of Patent: Jun. 11, 2019

(54) NETWORK FLOW BASED FRAMEWORK FOR CLOCK TREE OPTIMIZATION

(71) Applicant: Synopsys, Inc., Mountain View, CA (US)

(72) Inventors: Zuo Dai, San Jose, CA (US); Aiqun Cao, Sunnyvale, CA (US)

(73) Assignee: SYNOPSYS, INC., Mountain View, CA (US)

( * ) Notice: Subject to any disclaimer, the term of this patent is extended or adjusted under 35 U.S.C. 154(b) by 5 days.

(21) Appl. No.: 14/660,535

(22) Filed: Mar. 17, 2015

(65) Prior Publication Data

US 2015/0269298 A1 Sep. 24, 2015

Related U.S. Application Data

(60) Provisional application No. 61/968,996, filed on Mar. 21, 2014.

(51) Int. Cl.
*G06F 17/50* (2006.01)

(52) U.S. Cl.
CPC ........ *G06F 17/505* (2013.01); *G06F 2217/62* (2013.01)

(58) Field of Classification Search
CPC .................................................. G06F 17/5045

USPC ......................................................... 716/134
See application file for complete search history.

(56) References Cited

U.S. PATENT DOCUMENTS

| 5,175,843 A | * | 12/1992 | Casavant | ............ | G06F 17/5045 703/19 |
| 7,353,488 B1 | * | 4/2008 | Coffin | ................. | G06F 17/5045 707/999.1 |
| 7,814,451 B2 | * | 10/2010 | Furnish | ............... | G06F 17/5068 716/100 |

* cited by examiner

*Primary Examiner* — Jack Chiang
*Assistant Examiner* — Brandon Bowers
(74) *Attorney, Agent, or Firm* — Park, Vaughan, Fleming & Dowler LLP; Laxman Sahasrabuddhe (57) ABSTRACT

Systems and techniques for clock tree optimization are described. An electronic design automation (EDA) tool can receive a graph that represents a circuit design, wherein a set of trees in the graph can correspond to a set of clock trees in the circuit design. For each tree in the set of trees, a set of leaf node pairs can be determined. Next, for each leaf node pair, a flow can be created in the graph between the two leaf nodes in the leaf node pair. Aggregate flows can be determined for edges in the graph based on the flows. A set of edges based on the aggregate flows can be identified, and then circuitry corresponding to the set of edges can be identified. Next, the identified circuitry in the circuit design can be optimized.

20 Claims, 7 Drawing Sheets

NETWORK FLOW BASED FRAMEWORK FOR CLOCK TREE OPTIMIZATION

RELATED APPLICATION

This application claims priority to U.S. Provisional Patent Application No. 61/968,996, entitled "Network Flow Based Framework for Clock Tree Optimization," by Zuo Dai and Aiqun Cao, filed on 21 Mar. 2014, the contents of which are herein incorporated by reference in their entirety for all purposes.

BACKGROUND

Technical Field

This disclosure relates to electronic design automation (EDA). More specifically, this disclosure relates to network flow based framework for clock tree optimization.

Related Art

Clock tree synthesis refers to the process of creating a clock distribution network for distributing a clock signal to a set of sequential circuit elements in a circuit design. A circuit design may include multiple clock domains, and each clock domain can include multiple clock trees. Additionally, the circuit design may include multiple modes and corners, wherein certain clock trees or certain portions of clock trees are operational in a given mode, and wherein each corner corresponds to a particular set of operating and/or process conditions. The circuit design typically needs to satisfy timing requirements across all mode and corner combinations; therefore, the clock tree needs to be optimized across all mode and corner combinations.

The quality of the clock trees that are generated by clock tree synthesis can have a significant impact on downstream stages in the EDA flow, especially on timing closure. Hence, what are needed are systems and techniques for clock tree synthesis that can efficiently create high quality clock trees.

SUMMARY

Embodiments disclosed herein feature systems and techniques for optimizing a clock tree. Some embodiments can receive a graph that represents a circuit design, wherein the graph does not have any loops, wherein the graph includes a set of trees, and wherein each tree corresponds to a clock tree in the circuit design. Each tree includes a root node and a set of leaf nodes, wherein each root node corresponds to a clock source in the circuit design, and wherein each leaf node corresponds to a clock sink in the circuit design. Each root node is connected to each leaf node by a path comprising one or more edges, wherein each edge corresponds to a timing arc in the circuit design. For each tree in the set of trees, the embodiments can determine a set of leaf node pairs. Next, for each leaf node pair, the embodiments can create a flow in the graph between the two leaf nodes in the leaf node pair. The embodiments can then determine aggregate flows for edges in the graph based on the flows. Next, the embodiments can identify a set of edges based on the aggregate flows. The embodiments can then identify circuitry in the circuit design corresponding to the identified set of edges. Next, the embodiments can optimize the identified circuitry in the circuit design.

In some embodiments, each timing arc corresponds to either (1) a delay from an input pin of a cell to an output pin of the cell, or (2) a delay of a net that electrically connects an output pin of a first cell with an input pin of a second cell.

In some embodiments, each flow is equal to a constant value. In some embodiments, the flow between the leaf nodes of the leaf node pair is equal to a clock skew between the leaf nodes of the leaf node pair. In some embodiments, the flow between the leaf nodes of the leaf node pair is equal to a weighted clock skew between the leaf nodes of the leaf node pair, wherein each weight can correspond to a clock tree and/or corner (i.e., different clock trees and/or corners can have different weights, and the flow value for a given leaf node pair can be equal to the product of a clock skew between the leaf nodes of the leaf node pair and a weight corresponding to the clock tree and/or corner associated with the leaf node pair).

In some embodiments, identifying the set of edges in the graph comprises identifying an edge with a maximum aggregate flow. In some embodiments, identifying the set of edges in the graph comprises identifying an edge that has a maximum number of flows flowing through the edge.

In some embodiments, a path between each leaf node pair in the set of leaf node pairs corresponds to a path in a clock tree that has a maximum clock skew.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Overview of an EDA Design-Flow

Circuit designs are typically created using an EDA design-flow. Once the circuit design is finalized, it can undergo fabrication, packaging, and assembly to produce integrated circuit chips. An EDA design-flow can include multiple steps, and each step can involve using one or more EDA software tools. Some EDA steps and software tools are described below. These examples of EDA steps and software tools are for illustrative purposes only and are not intended to limit the embodiments to the forms disclosed.

Some EDA software tools enable circuit designers to describe the functionality that the circuit designers want to implement. These tools also enable circuit designers to perform what-if planning to refine functionality, check costs, etc. During logic design and functional verification, the HDL (hardware description language), e.g., Verilog, code can be written and the design can be checked for functional accuracy, e.g., the design can be checked to ensure that it produces the correct outputs.

During synthesis and design for test, the HDL code can be translated to a netlist using one or more EDA software tools. Further, the netlist can be optimized for the target technology, and tests can be designed and implemented to check the finished chips. During netlist verification, the netlist can be checked for compliance with timing constraints and for correspondence with the HDL code.

During design planning, an overall floorplan for the chip can be constructed and analyzed for timing and top-level routing. During physical implementation, circuit elements can be positioned in the layout and can be electrically coupled.

During analysis and extraction, the circuit's functionality can be verified at a transistor level and parasitics can be extracted. During physical verification, the design can be checked to ensure correctness for manufacturing, electrical issues, lithographic issues, and circuitry.

During resolution enhancement, geometric manipulations can be performed on the layout to improve manufacturability of the design. Some embodiments disclosed herein can be used during resolution enhancement. During mask data preparation, the design can be "taped-out" to produce masks which are used during fabrication.

Clock Trees and Clock Tree Optimization

Figure 1:
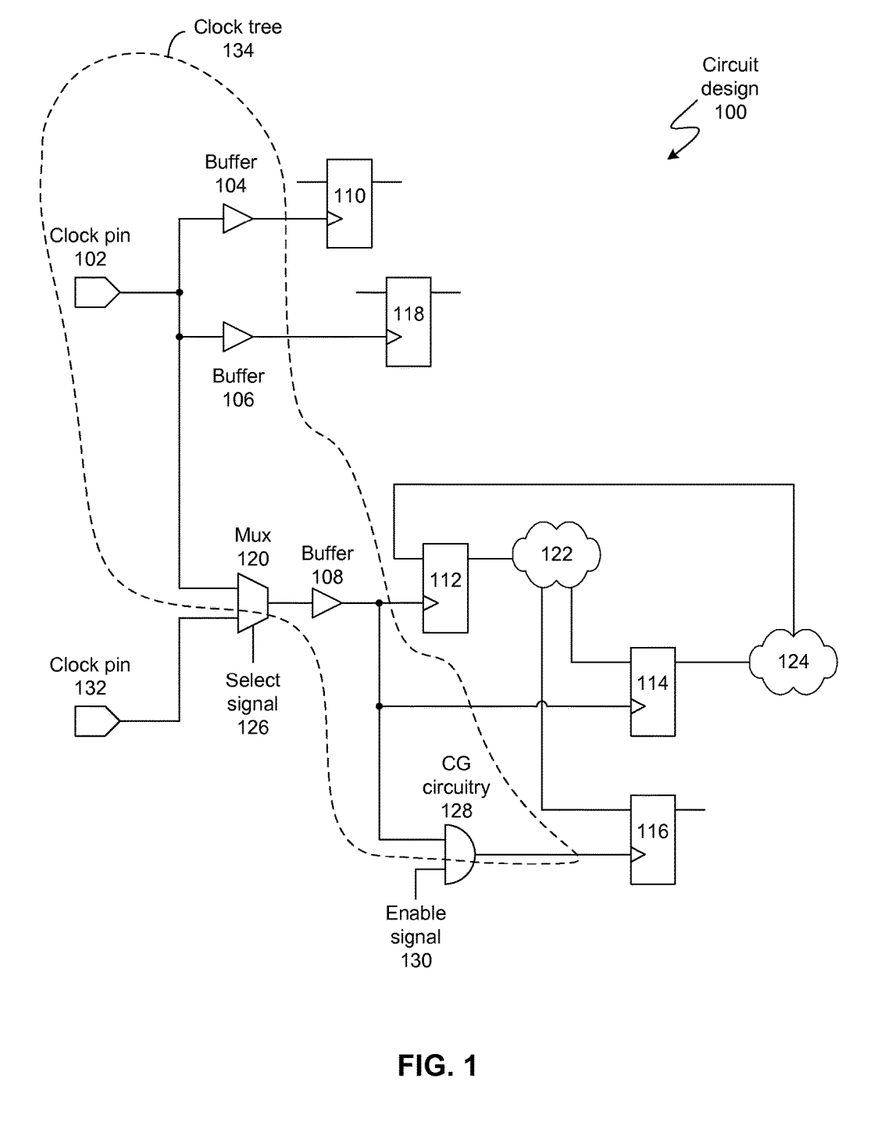
FIG. 1 illustrates a synchronous circuit in accordance with some embodiments described herein.

Synchronous circuit designs can be viewed as a collection of sequential circuit elements that are electrically connected via combinational logic clouds. For example, FIG. 1 illustrates a synchronous circuit in accordance with some embodiments described herein. Circuit design 100 includes buffers 104, 106, and 108, multiplexer 120, clock gating circuitry 128, sequential circuit elements 110, 112, 114, 116, and 118, and combinational logic clouds 122 and 124 (note that FIG. 1 only illustrates a portion of circuit design 100, which may include millions of other circuit elements). A sequential circuit element can generally be any element that is timed based on a clock signal. For example, a flip-flop is a sequential circuit element. A combinational logic cloud includes one or more combinational logic gates (e.g., AND gates, OR gates, NOT gates, XOR gates, multiplexers, demultiplexers, buffers, repeaters, etc.), but does not include any sequential circuit elements.

In a synchronous circuit, data transfer between sequential circuit elements is synchronized using one or more clock signals. For example, sequential circuit element 112 can launch a signal that passes through combinational logic cloud 122 (which may logically combine the signal with other signals), and which can then be captured by sequential circuit element 114. The launch and capture are synchronized based on the respective clock signals that are provided to sequential circuit elements 112 and 114.

A clock tree comprises circuitry that distributes a clock signal to one or more sequential circuit elements in the circuit design. A circuit design can have multiple operating modes, and depending on the operating mode of the circuit design, a clock signal may be distributed to different sets of sequential circuit elements. For example, in a first mode, select signal 126 can cause multiplexer 120 to select the clock signal from clock pin 102, and enable signal 130 can be asserted (thereby causing the clock signal to pass through clock gating circuitry 128), thereby distributing the selected clock signal to sequential circuit elements 110, 112, 114, 116, and 118. In a second mode, select signal 126 can cause multiplexer 120 to select the clock signal from clock pin 102, and enable signal 130 can be de-asserted (thereby causing the clock signal to be blocked by clock gating circuitry 128), thereby distributing the selected clock signal to sequential circuit elements 110, 112, 114, and 118, but not to sequential circuit element 116. In a third mode, select signal 126 can select the clock signal from clock pin 132, and enable signal 130 can be asserted (thereby causing the clock signal to pass through clock gating circuitry 128), thereby distributing the clock signal from clock pin 102 to sequential circuit elements 110 and 118, and distributing the clock signal from clock pin 132 to sequential circuit elements 112, 114, and 116.

A circuit design can include multiple clock trees. For example, in a first mode of circuit design 100, the clock signal from clock pin 102 is distributed through clock tree 134, which includes buffers 104, 106, and 108, and distributes a clock signal to sequential circuit elements 110, 112, 114, 116, and 118. However, circuit design 100 also includes the clock tree that is rooted at clock pin 132 and that distributes the clock signal from clock pin 132 to sequential circuit elements 112, 114, and 116 in the third mode of circuit design 100.

A clock domain can refer to a portion of a circuit design that is clocked using a given clock signal. For example, in the third mode described above, sequential circuit elements 110 and 118 can be part of the clock domain that corresponds to the clock signal that is distributed from clock pin 102, and sequential circuit elements 112, 114, and 116 can be part of the clock domain that corresponds to the clock signal that is distributed from clock pin 132.

A corner can correspond to a set of operating conditions (e.g., temperature, voltage, etc.) and/or process conditions (e.g., a set of manufacturing parameters that affect the power and delay characteristics of the manufactured circuit components). A combination of a particular mode and a particular corner is referred to as a scenario.

The timing requirements for a circuit design usually need to be satisfied for all mode and corner combinations. Clock tree optimization is a process that optimizes one or more clock tree metrics, e.g., global clock skew, local clock skew, latency, etc. Optimizing a clock tree can help a circuit design to satisfy timing requirements. Clock tree optimization can be a complicated process when a portion of the circuit design is shared among multiple clock trees, and when the optimization process has to optimize the clock trees across multiple mode and corner combinations. Existing clock tree optimization approaches may not produce high quality clock trees because they are unable to properly deal with the interdependencies among different clock domains, modes, and corners. For example, a given optimization transformation (e.g., replacing a cell instance with a larger equivalent cell) may reduce the clock skew in one mode, but increase the clock skew in another mode. Likewise, a given optimization transformation may reduce the clock skew in one corner, but increase the clock skew in another corner.

In contrast to existing approaches, some embodiments described herein can guide clock tree optimization by taking into account interdependencies among different clock domains, modes, and corners. Specifically, some embodiments described herein can guide the clock tree optimization process by simultaneously considering the clock skew and latency of clock trees that are used in all of the modes of the circuit design and also across all operating and process corners. The quality of the clock trees generated by embodiments described herein can be significantly better than the quality of the clock trees generated by existing approaches.

Network Flow Based Framework for Clock Tree Optimization

Figure 2:
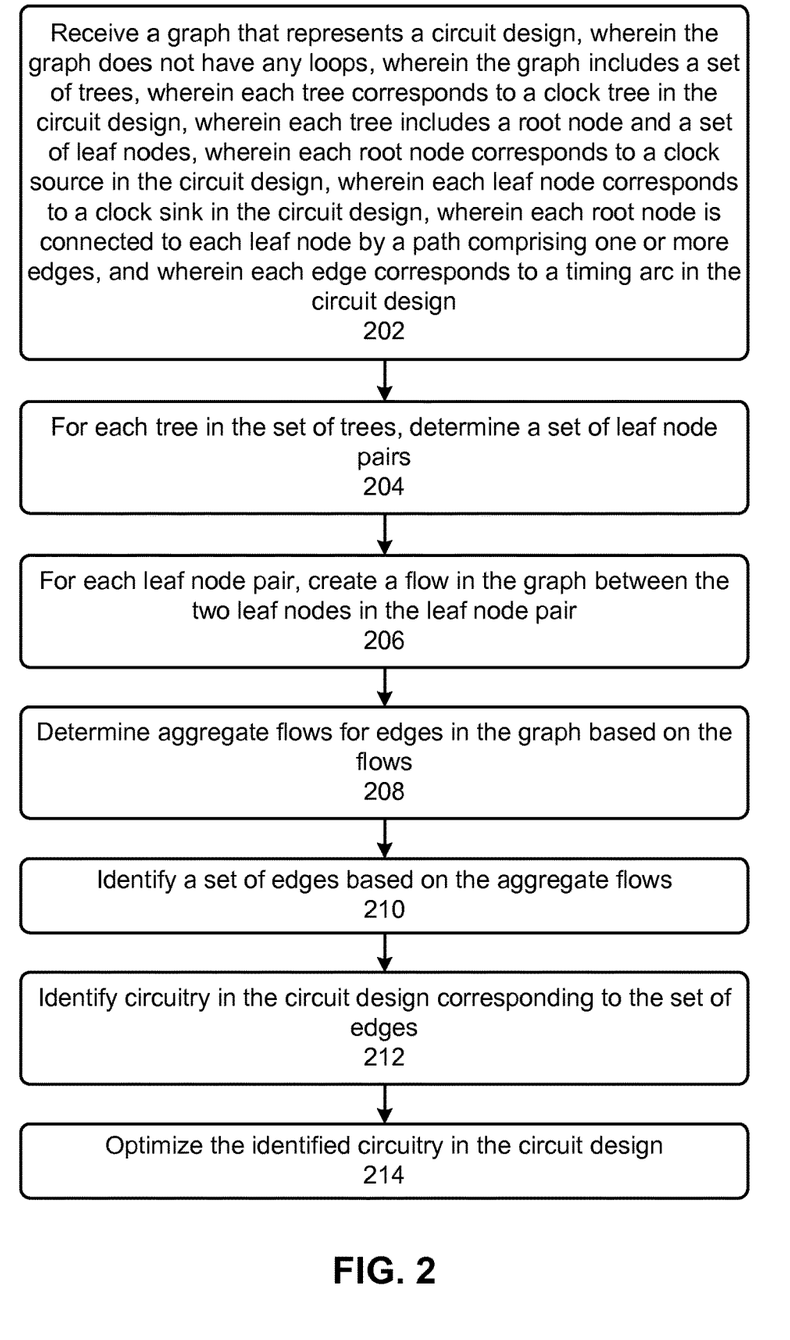
FIG. 2 illustrates a process for clock tree optimization in accordance with some embodiments described herein.

FIG. 2 illustrates a process for clock tree optimization in accordance with some embodiments described herein. The process can begin by receiving a graph that represents a circuit design, wherein the graph does not have any loops, wherein the graph includes a set of trees, wherein each tree corresponds to a clock tree in the circuit design, wherein each tree includes a root node and a set of leaf nodes, wherein each root node corresponds to a clock source in the circuit design, wherein each leaf node corresponds to a clock sink in the circuit design, wherein each root node is connected to each leaf node by a path comprising one or more edges, and wherein each edge corresponds to a timing arc in the circuit design (operation 202).

Figure 3A:
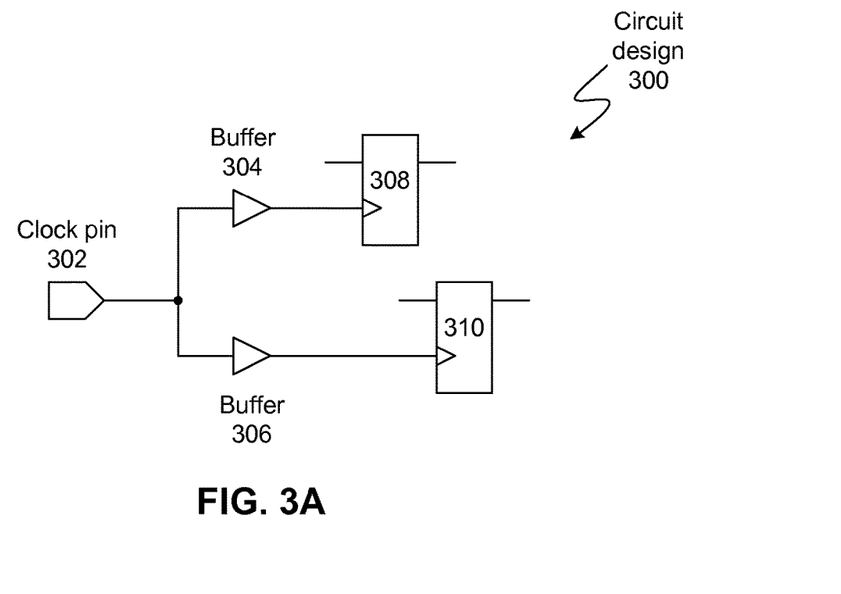
FIGS. 3A-3B illustrate a graph that represents a circuit design in accordance with some embodiments described herein.
Figure 3B:
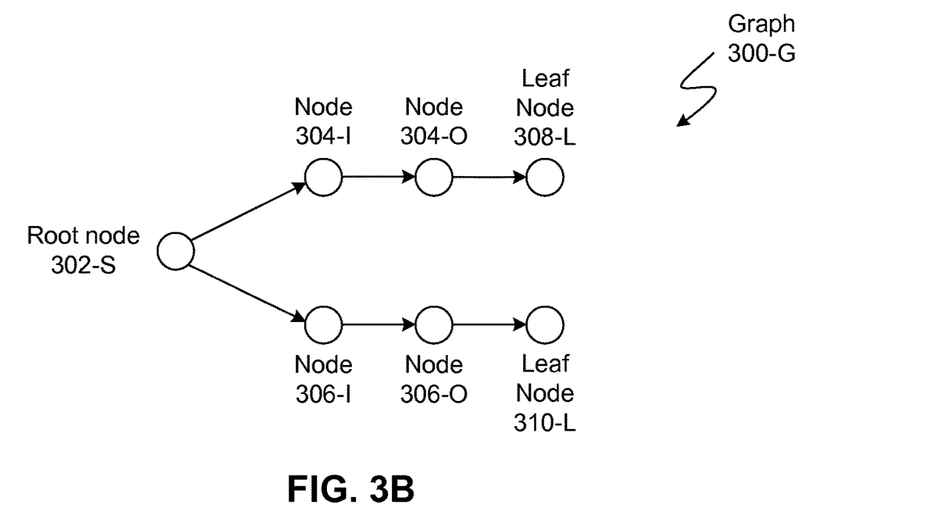

FIGS. 3A-3B illustrate a graph that represents a circuit design in accordance with some embodiments described herein. In circuit design 300 shown in FIG. 3A, the clock signal from clock pin 302 is distributed to the clock inputs of sequential circuit elements 308 and 310 via a clock tree that includes buffers 304 and 306. At least one timing arc corresponds to a delay from an input pin of a cell to an output pin of the cell. FIG. 3B illustrates graph 300-G that represents circuit design 300. The graph representation shown in FIG. 3B is only for purposes of illustration and description, and is not intended to limit the scope of the embodiments described herein. Many variations and modifications for creating a graph representation of a circuit design will be apparent to those skilled in the art. In FIG. 3B, root node 302-S corresponds to clock pin 302, nodes 304-I and 304-O correspond to buffer 304, nodes 306-I and 306-O correspond to buffer 306, leaf node 308-L corresponds to the clock input of sequential circuit element 308, and leaf node 310-L corresponds to the clock input of sequential circuit element 310.

The edges in graph 300-G can correspond to timing arcs. For example, the edge from node 304-O to leaf node 308-L can correspond to the timing arc from the output pin of a first cell (e.g., buffer 304) to the input pin of a second cell (e.g., clock input pin of sequential circuit element 308), wherein the timing arc represents the delay of the net that electrically connects the output pin of the first cell (e.g., buffer 304) to the input pin of the second cell (e.g., clock input pin of sequential circuit element 308). On the other hand, the edge from node 304-I to node 304-O can correspond to the timing arc from an input pin of a cell (e.g., buffer 304) to an output pin of the cell (e.g., buffer 304), wherein the timing arc represents the delay between the input and output pins of the cell.

Returning to FIG. 2, next, for each tree in the set of trees, the process can determine a set of leaf node pairs (operation 204). In some embodiments, the set of leaf node pairs can include all possible leaf node pairs. In some embodiments, the set of leaf node pairs can be such that a path between each leaf node pair in the set of leaf node pairs corresponds to a path in the circuit design that has a large clock skew, e.g., a clock skew that is greater than a threshold, or a clock skew that is a maximum clock skew in the tree. For each leaf node pair, the process can then create a flow in the graph between the two leaf nodes in the leaf node pair (operation 206).

Figure 4A:
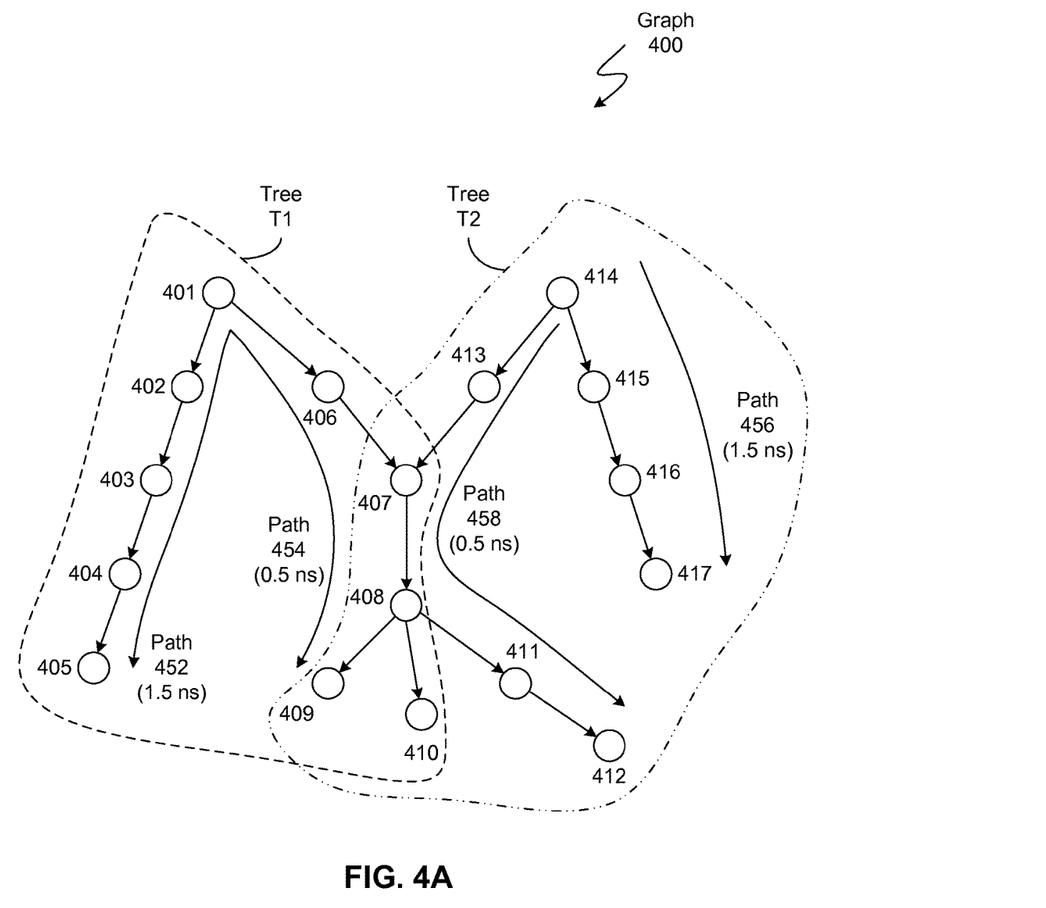
FIG. 4A illustrates a graph that represents a circuit design that includes a set of trees in accordance with some embodiments described herein.

FIG. 4A illustrates a graph that represents a circuit design that includes a set of trees in accordance with some embodiments described herein. Graph 400 includes two trees—a first tree T1 that is rooted at node 401 and includes nodes 401-410 and a second tree T2 that is rooted at node 414 and includes nodes 407-417. Each of these trees corresponds to a clock tree in the circuit design. Let us assume that tree T1 is used during a first mode of the circuit design and tree T2 is used during a second mode of the circuit design.

In tree T1, let path 452 be the path with the maximum delay from the root node to a leaf node, and path 454 be the path with the minimum delay from the root node to a leaf node. Specifically, let the delay of path 452 (i.e., the delay from root node 401 to leaf node 405) be equal to 1.5 ns and the delay of path 454 (i.e., the delay from root node 401 to leaf node 409) be equal to 0.5 ns. Additionally, let us assume that the delay from root node 401 to leaf node 410 is also 0.5 ns (the corresponding path has not been shown in FIG. 4A for the sake of clarity).

Likewise, in tree T2, let path 456 be the path with the maximum delay from the root node to a leaf node, and path 458 be the path with the minimum delay from the root node to a leaf node. Specifically, let the delay of path 456 (i.e., the delay from root node 414 to leaf node 417) be equal to 1.5 ns. and the delay of path 458 (i.e., the delay from root node 414 to leaf node 412) be equal to 0.5 ns. Also, let us assume that the delays from root node 414 to leaf nodes 409 and 410 are also equal to 0.5 ns.

Figure 4B:
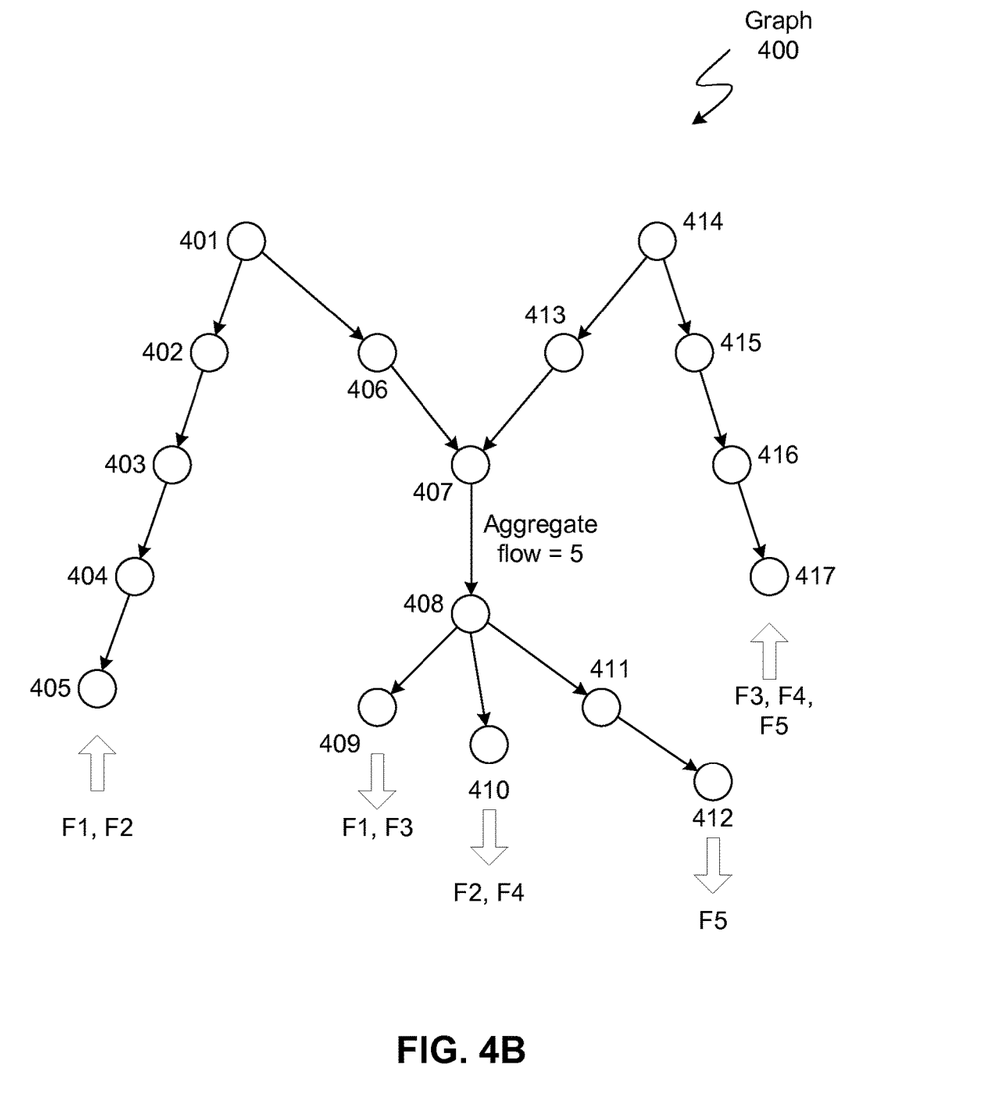
FIG. 4B illustrates how flows can be created in the graph in accordance with some embodiments described herein.

FIG. 4B illustrates how flows can be created in the graph in accordance with some embodiments described herein. In some embodiments, the process can create a flow that begins at the leaf node that has the higher latency value and ends at the leaf node that has the lower latency value. For example, flows F1 and F2 begin at node 405 and end at nodes 409 and 410, respectively. Flows F3, F4, and F5 begin at node 417 and end at nodes 409, 410, and 412, respectively (in network flow terminology, node 405 is a source for flows F1 and F2; node 417 is a source for flows F3, F4, and F5; node 409 is a sink for flows F1 and F3; node 410 is a sink for flows F2 and F4; and node 412 is a sink for flow F5).

In some embodiments, each flow can be a constant value, e.g., the value "1." In other embodiments, each flow can be equal to a clock skew between the leaf nodes of the leaf node pair. For example, the value of flow F1 can be equal to (1.5 ns.−0.5 ns.)=1.0 ns. In some embodiments, the flow values can correspond to the importance of the tree in which the flows exist. For example, suppose reducing the clock skew in tree T1 is more important than reducing the clock skew in tree T2, then flows F1 and F2 (which are in tree T1) can be assigned a higher value than flows F3, F4, and F5 (which are in tree T2). In some embodiments, the flow between the leaf nodes of the leaf node pair is equal to a weighted clock skew between the leaf nodes of the leaf node pair, wherein each weight can correspond to a clock tree and/or corner (i.e., different clock trees and/or corners can have different weights, and the flow value for a given leaf node pair can be equal to the product of a clock skew between the leaf nodes of the leaf node pair and a weight corresponding to the clock tree and/or corner associated with the leaf node pair). These examples of flow values have been presented only for purposes of illustration and description, and are not intended to limit the scope of the embodiments disclosed herein. Many variations and modifications for assigning flow values will be apparent to those skilled in the art.

Once the flows have been created in the graph, the process can then determine aggregate flows for edges in the graph based on the flows (operation 208 in FIG. 2). The term "aggregate flow" generally refers to a value that is computed based on a set of network flows. Specifically, the process can create a network flow problem based on the sources and sinks defined in the graph, and solve the network flow problem to obtain the flow values for each edge. The network flow problem is well known in the art, and can be defined as follows. Let G=(V, E) be a finite directed graph (edge capacity constraints may not be required in the network flow problems that are created by some embodiments described herein). Some of the vertices in graph G are called source vertices and some of the vertices are called sink vertices. Each source vertex corresponds to a sink vertex, and each flow originates at a source vertex and terminates at the corresponding sink vertex. Given a set of flows that originate at source vertices and terminate at sink vertices, the network flow problem involves assigning flows to edges (u, v) in the graph to satisfy the flow conservation property, i.e., for each vertex v that is not a source or a sink for a given flow, the sum of all flows entering the vertex v must equal the sum of all flows leaving the vertex v. Note that a source vertex has a net flow leaving the vertex and a sink vertex has a net flow entering the vertex.

In one embodiment, the process can create a single-commodity network flow problem based on the flows, and the solution of the network flow problem can directly provide the aggregate flow for each edge. In another embodiment, the process can create a multi-commodity network flow problem based on the flows (e.g., the flow for each leaf node pair can be a distinct commodity), and solve the network flow problem to obtain the individual commodity flows for each edge. Next, the process can add the individual commodity flows for a given edge to obtain the aggregate flow for the edge. For example, the aggregate flow through the edge from node 407 to node 408 can be equal to 5 (assuming a flow of "1" for each of the five flows F1-F5).

Next, the process can identify a set of edges based on the aggregate flows (operation 210). In some embodiments, the process can identify the set of edges in the graph that have a maximum aggregate flow, or whose flow values are greater than a given threshold. The aggregate flow through an edge can correspond to the importance or criticality of the edge. For example, the process can sort the edges in decreasing order of their aggregate flows and identify the top N edges, i.e., the process can identify the N edges with the highest aggregate flows. For example, the process can identify the edge from node 407 to node 408 as the edge with the maximum aggregate flow.

In some embodiments, the process can also determine the number of flows passing through the edge (if each flow is equal to one and all flows are flowing in the same direction through an edge, then the aggregate flow of the edge will be equal to the number of flows passing through the edge). The number of flows that pass through an edge can correspond to the sensitivity of the edge because a change in the delay of the edge will change the clock skew or latency associated with each flow that is passing through the edge. In some embodiments, the process can use both the aggregate flow (i.e., the importance or criticality information) of an edge and the number of flows (i.e., the sensitivity information) of the edge to identify the set of edges. For example, the process can identify the top N edges with the highest aggregate flows, and then use the sensitivity information to determine the order in which optimization is performed on the N edges, e.g., the process can optimize the N edges in order of their decreasing sensitivity.

Next, the process can identify circuitry in the circuit design corresponding to the set of edges (operation 212). The process can then optimize the identified circuitry in the circuit design (operation 214). Recall that each edge corresponds to a timing arc in the circuit design, and each timing arc corresponds to some circuitry in the circuit design. Specifically, if a timing arc corresponds to the delay from an input pin of a cell to the output pin of the cell, then the process can identify the cell as the circuitry corresponding to the edge. The process can optimize the cell by replacing the cell with an equivalent cell that has a different delay value, thereby reducing the clock skew (or latency depending on what is being optimized). On the other hand, if the timing arc corresponds to the delay of the net that electrically connects the output pin of the first cell to the input pin of the second cell, then the process can identify the first cell, the second cell, and/or the net that electrically connects the output pin of the first cell to the input pin of the second cell as the circuitry associated with the edge. The process can replace the first cell and/or the second cell with equivalent cells that have different delay values, thereby reducing the clock skew (or latency, depending on what is being optimized). The process may also perform a rip-and-reroute operation on the net to change its delay.

Note that the individual flows that are routed through a given edge carry the clock skew information. The process can use this information to determine the amount of optimization that is to be performed on the circuitry. In some embodiments, the process illustrated in FIG. 2 can be used to incrementally optimize the circuit design. Specifically, after the process optimizes the circuitry that was identified in a given iteration (i.e., performs operation 214), the process can update the timing information for the circuit design based on the optimized circuitry, and identify the next circuitry to optimize (e.g., by using the process shown in FIG. 2). This iterative process can continue until one or more termination criteria have been met, e.g., after the clock skew has been optimized by a pre-determined amount, or after circuitry associated with a pre-determined number of edges has been optimized, etc.

Figure 5A:
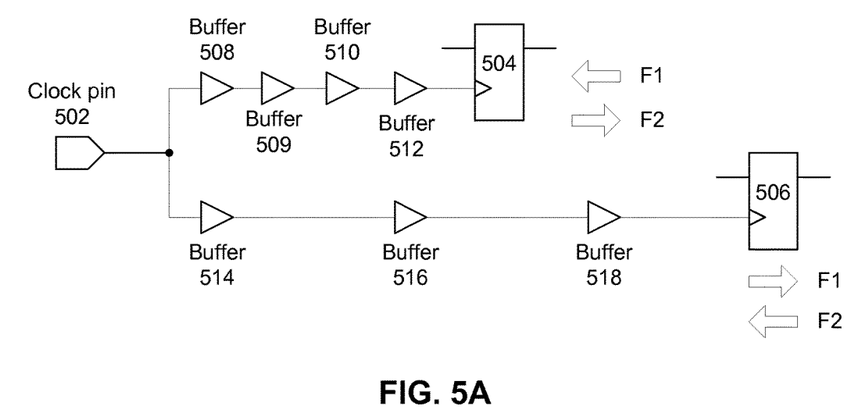
FIGS. 5A-5B illustrate how a clock tree can be optimized across multiple corners in accordance with some embodiments described herein.
Figure 5B:
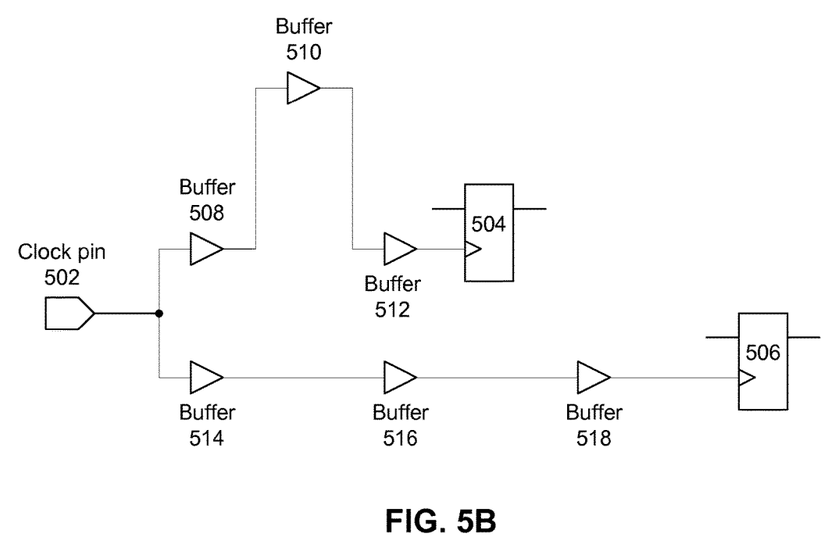

FIGS. 5A-5B illustrate how a clock tree can be optimized across multiple corners in accordance with some embodiments described herein. FIG. 5A illustrates a portion of a circuit design that includes two paths in a clock tree. A first path P1 begins at clock pin 502, passes through buffers 508, 509, 510, and 512, and ends at sequential circuit element 504. A second path P2 begins at clock pin 502, passes through buffers 514, 516, and 518, and ends at sequential circuit element 506. Let us assume that the clock latency along path P1 is greater than path P2 in corner C1, and the clock latency along path P2 is greater than path P1 in corner C2. One reason why the delays in paths P1 and P2 may behave this way is that wire delays and cell delays may change by different amounts when operating and/or process conditions are changed (note that path P2 has a greater contribution from wire delay than path P1). Let us also assume that the clock skew between paths P1 and P2 is the worst clock skew in both corners.

Conventional clock tree optimization techniques may not be able to optimize the clock skew (i.e., reduce or eliminate clock skew) in such situations. For example, a conventional clock tree optimization technique may try to reduce clock skew in corner C1 by increasing the delay of path P2 (e.g., by resizing, relocating, and/or inserting extra buffers). However, this will worsen the clock skew in corner C2. The conventional clock tree optimization technique may then try to reduce the clock skew in corner C2 by decreasing the delay of path P2 (e.g., by resizing, relocating, or removing one or more buffers). However, this will worsen the clock skew in corner C1. This "ping-pong" may cause the clock tree optimization technique to run for a long time and terminate without reducing the clock skew.

Some embodiments described herein can detect such situations, thereby enabling the clock tree to be optimized in a way that does not cause the above-described "ping-pong" phenomenon. In particular, an embodiment can create a flow for each corner. For example, flow F1 can be created for corner C1 that begins at sequential circuit element 504 (or the node in the graph that corresponds to sequential circuit element 504) and ends at sequential circuit element 506 (or the node in the graph that corresponds to sequential circuit element 506), and flow F2 can be created for corner C2 that begins at sequential circuit element 506 (or the node in the graph that corresponds to sequential circuit element 506) and ends at sequential circuit element 504 (or the node in the graph that corresponds to sequential circuit element 504). Next, the embodiment can determine that the flows F1 and F2 cancel each other out because they are flowing in different directions. This can indicate a situation where a "ping-pong" phenomenon may occur if a conventional clock tree optimization technique is used.

When some embodiments detect that one or more edges have flows that are flowing in opposite directions, the embodiments may apply a combination transformation to the circuitry associated with the one or more edges. A combination transformation comprises two or more transformations, wherein some of the transformations increase the delay of the circuitry and other transformations decrease the delay of the circuitry. For example, some embodiments may remove one or more buffers on one of the paths (thereby decreasing the buffer delay along the path), and at the same time reroute the path over a longer route (thereby increasing the wire delay along the path) so that the number of buffers and wire lengths of the two paths are more comparable, i.e., the difference in the number of buffers and wire lengths between the two paths is less.

FIG. 5B illustrates a result of clock tree optimization in accordance with some embodiments described herein. Note that buffer 509 shown in FIG. 5A has been removed and buffer 510 has been relocated so that the buffer delays and the wire delays of the two paths P1 and P2 are more comparable than they were in FIG. 5A. The above-described "ping-pong" phenomenon occurred because the wire delays and buffer delays of paths P1 and P2 varied by different amounts when we went from corner C1 to corner C2. After the combination transformation (see e.g., FIG. 5B), the delays of paths P1 and P2 are expected to increase and decrease by similar amounts when operating or process conditions are changed, thereby ensuring that the clock skew remains close to zero across multiple corners. In this manner, some embodiments can avoid the "ping-pong" phenomenon that can occur when conventional clock tree optimization techniques are used.

Computer System

Figure 6:
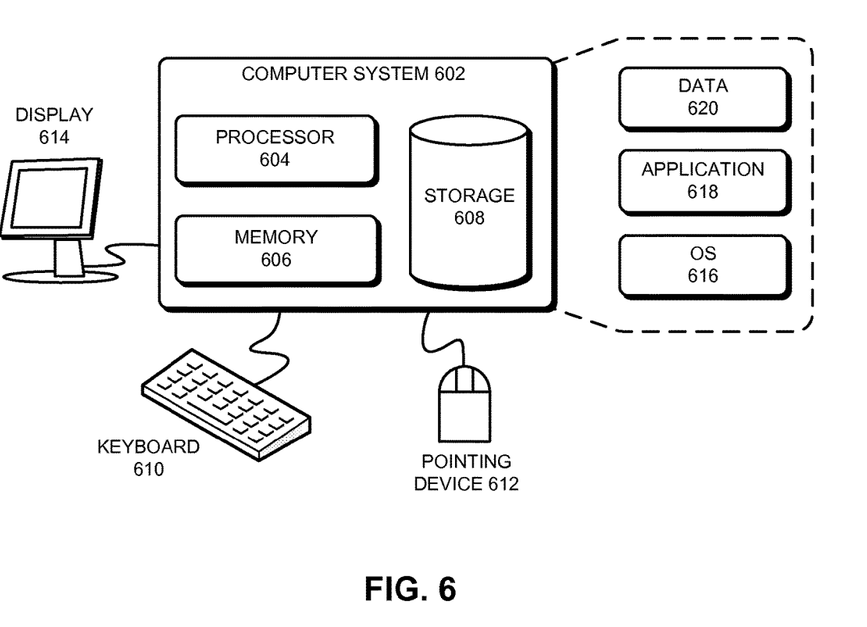
FIG. 6 illustrates a computer system in accordance with some embodiments described in this disclosure.

FIG. 6 illustrates a computer system in accordance with some embodiments described in this disclosure. Computer system 602 can include processor 604, memory 606, and storage device 608. Computer system 602 can be coupled to display device 614, keyboard 610, and pointing device 612. Storage device 608 can store operating system 616, application 618, and data 620. Data 620 can include input required by application 618 and/or output generated by application 618. Computer system 602 may automatically (or based on user input) perform one or more operations that are implicitly or explicitly described in this disclosure. For example, computer system 602 can load application 618 into memory 606, and application 618 can then be used to perform a process implicitly or explicitly described in this disclosure.

CONCLUSION

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a computer-readable storage medium or device, so that when a computer system reads and executes the code and/or data, the computer system performs the associated methods and processes. The methods and processes can also be partially or fully embodied in hardware modules or apparatuses, so that when the hardware modules or apparatuses are activated, they perform the associated methods and processes. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A non-transitory computer-readable storage medium storing instructions that, when executed by a computer, cause the computer to perform a method for clock tree optimization, the method comprising:

receiving a graph that represents a circuit design, wherein the graph does not have any loops, wherein the graph includes a set of trees, wherein each tree corresponds to a clock tree in the circuit design, wherein each tree includes a root node and a set of leaf nodes, wherein each root node corresponds to a clock source in the circuit design, wherein each leaf node corresponds to a clock sink in the circuit design, wherein each root node is connected to each leaf node by a path comprising one or more edges, and wherein each edge corresponds to a timing arc in the circuit design;

for each tree in the set of trees, determining a set of leaf node pairs;

for each leaf node pair, creating a flow in the graph between the two leaf nodes in the leaf node pair;

determining aggregate flows for edges in the graph based on the flows;

identifying a set of edges based on the aggregate flows;

identifying circuitry in the circuit design corresponding to the identified set of edges; and optimizing the identified circuitry in the circuit design, wherein said optimizing comprises at least one of: (1) replacing a circuit element in the identified circuitry with another circuit element, or (2) performing a rip-and-reroute operation on a net in the identified circuitry, wherein the circuit design is provided to a next step in a circuit design and manufacturing process which, when completed, produces a physical integrated circuit that is based on the circuit design.

2. The non-transitory computer-readable storage medium of claim 1, wherein at least one timing arc corresponds to a delay from an input pin of a cell to an output pin of the cell.

3. The non-transitory computer-readable storage medium of claim 1, wherein at least one timing arc corresponds to a delay of a net that electrically connects an output pin of a first cell with an input pin of a second cell.

4. The non-transitory computer-readable storage medium of claim 1, wherein each flow is equal to a constant value.

5. The non-transitory computer-readable storage medium of claim 1, wherein the flow between the leaf nodes of the leaf node pair is equal to a clock skew between the leaf nodes of the leaf node pair.

6. The non-transitory computer-readable storage medium of claim 1, wherein said identifying the set of edges in the graph comprises identifying an edge with a maximum aggregate flow.

7. The non-transitory computer-readable storage medium of claim 1, wherein said identifying the set of edges in the graph comprises identifying an edge that has a maximum number of flows flowing through the edge.

8. The non-transitory computer-readable storage medium of claim 1, wherein a path between each leaf node pair in the set of leaf node pairs corresponds to a path in a clock tree that has a maximum clock skew.

9. The non-transitory computer-readable storage medium of claim 1, wherein each flow is equal to a constant value.

10. A method for performing clock tree optimization based on a graph that represents a circuit design, wherein the graph does not have any loops, wherein the graph includes a set of trees, wherein each tree corresponds to a clock tree in the circuit design, wherein each tree includes a root node and a set of leaf nodes, wherein each root node corresponds to a clock source in the circuit design, wherein each leaf node corresponds to a clock sink in the circuit design, wherein each root node is connected to each leaf node by a path comprising one or more edges, and wherein each edge corresponds to a timing arc in the circuit design, the method comprising:

for each tree in the set of trees, determining a set of leaf node pairs;

for each leaf node pair, creating a flow in the graph between the two leaf nodes in the leaf node pair;

determining aggregate flows for edges in the graph based on the flows;

identifying a set of edges based on the aggregate flows;

identifying circuitry in the circuit design corresponding to the identified set of edges; and optimizing, by computer, the identified circuitry in the circuit design, wherein said optimizing comprises at least one of: (1) replacing a circuit element in the identified circuitry with another circuit element, or (2) performing a rip-and-reroute operation on a net in the identified circuitry, wherein the circuit design is provided to a next step in a circuit design and manufacturing process which, when completed, produces a physical integrated circuit that is based on the circuit design.

11. The method of claim 10, wherein at least one timing arc corresponds to a delay from an input pin of a cell to an output pin of the cell.

12. The method of claim 10, wherein at least one timing arc corresponds to a delay of a net that electrically connects an output pin of a first cell with an input pin of a second cell.

13. The method of claim 10, wherein each flow is equal to a constant value.

14. The method of claim 10, wherein the flow between the leaf nodes of the leaf node pair is equal to a clock skew between the leaf nodes of the leaf node pair.

15. The method of claim 10, wherein said identifying the set of edges in the graph comprises identifying an edge with a maximum aggregate flow.

16. The method of claim 10, wherein said identifying the set of edges in the graph comprises identifying an edge that has a maximum number of flows flowing through the edge.

17. The method of claim 10, wherein a path between each leaf node pair in the set of leaf node pairs corresponds to a path in a clock tree that has a maximum clock skew.

18. An apparatus, comprising:

a processor; and a non-transitory computer-readable storage medium storing instructions for an electronic design automation (EDA) tool that, when executed by the processor, cause the apparatus to perform a method for clock tree optimization based on a graph that represents a circuit design, wherein the graph does not have any loops, wherein the graph includes a set of trees, wherein each tree corresponds to a clock tree in the circuit design, wherein each tree includes a root node and a set of leaf nodes, wherein each root node corresponds to a clock source in the circuit design, wherein each leaf node corresponds to a clock sink in the circuit design, wherein each root node is connected to each leaf node by a path comprising one or more edges, and wherein each edge corresponds to a timing arc in the circuit design, the method comprising:

for each tree in the set of trees, determining a set of leaf node pairs;

for each leaf node pair, creating a flow in the graph between the two leaf nodes in the leaf node pair;

determining aggregate flows for edges in the graph based on the flows;

identifying a set of edges based on the aggregate flows;

identifying circuitry in the circuit design corresponding to the identified set of edges; and optimizing the identified circuitry in the circuit design, wherein said optimizing comprises at least one of: (1) replacing a circuit element in the identified circuitry with another circuit element, or (2) performing a rip-and-reroute operation on a net in the identified circuitry, wherein the circuit design is provided to a next step in a circuit design and manufacturing process which, when completed, produces a physical integrated circuit that is based on the circuit design.

19. The apparatus of claim 18, wherein at least one timing arc corresponds to a delay from an input pin of a cell to an output pin of the cell.

20. The apparatus of claim 18, wherein at least one timing arc corresponds to a delay of a net that electrically connects an output pin of a first cell with an input pin of a second cell.

* * * * *